(12) United States Patent
Wang et al.

(10) Patent No.: US 12,245,358 B2
(45) Date of Patent: Mar. 4, 2025

(54) CIRCUIT BOARD WITH EMBEDDED ELECTRONIC COMPONENT AND MANUFACTURING METHOD THEREOF

(71) Applicants: QING DING PRECISION ELECTRONICS (HUAIAN) CO., LTD, Huai an (CN); Avary Holding (Shenzhen) Co., Limited., Shenzhen (CN); GARUDA TECHNOLOGY CO., LTD., New Taipei (TW)

(72) Inventors: Ying Wang, Shenzhen (CN); Yong-Quan Yang, Qinhuangdao (CN)

(73) Assignees: QING DING PRECISION ELECTRONICS (HUAIAN) CO., LTD, Huai an (CN); Avary Holding (Shenzhen) Co., Limited., Shenzhen (CN); GARUDA TECHNOLOGY CO., LTD., New Taipei (TW)

( * ) Notice: Subject to any disclaimer, the term of this patent is extended or adjusted under 35 U.S.C. 154(b) by 235 days.

(21) Appl. No.: 18/125,687

(22) Filed: Mar. 23, 2023

(65) Prior Publication Data

US 2024/0196512 A1 Jun. 13, 2024

(30) Foreign Application Priority Data

Dec. 12, 2022 (CN) .......................... 202211599666.4

(51) Int. Cl.
*H05K 1/02* (2006.01)
*H05K 1/18* (2006.01)
(Continued)

(52) U.S. Cl.
CPC ........... *H05K 1/0203* (2013.01); *H05K 1/185* (2013.01); *H05K 3/06* (2013.01); *H05K 3/30* (2013.01)

(58) Field of Classification Search
CPC .... H05K 1/0204; H05K 1/0206; H05K 1/023; H05K 1/0298; H05K 1/036; H05K 1/183;
(Continued)

(56) References Cited

U.S. PATENT DOCUMENTS

2017/0117162 A1* 4/2017 Busche ................... H01L 21/56
2020/0118990 A1* 4/2020 Xu ....................... H01L 23/5383
(Continued)

FOREIGN PATENT DOCUMENTS

CN 114126189 A * 3/2022
CN 115332198 A * 11/2022

OTHER PUBLICATIONS

CN-115332198-A English Translation (Year: 2022).*
CN-114126189-A English Translation (Year: 2022).*

*Primary Examiner* — Amir A Jalali
(74) *Attorney, Agent, or Firm* — ScienBiziP, P.C.

(57) ABSTRACT

A circuit board includes a circuit substrate. The circuit substrate includes an insulating substrate and an electronic component embedded therein. The insulating substrate defines two first slots. A first phase change material fills in the two first slots and thermally connects to the electronic component. A first wiring layer is formed on a surface of the insulating substrate, the first wiring layer covers the two first slots and thermally connects to the first phase change material. A second wiring layer is formed on another surface of the insulating substrate. The second wiring layer includes a plurality of wiring portions and a wiring slot formed between adjacent wiring portions. The electronic component electrically connects to the second wiring portion. A second phase change material fills in at least one wiring slot and thermally connects a portion of the wiring portions together to form a heat dissipation zone.

18 Claims, 8 Drawing Sheets

(51) Int. Cl.
*H05K 3/06* (2006.01)
*H05K 3/30* (2006.01)

(58) Field of Classification Search
CPC ...... H05K 1/186; H05K 1/188; H05K 3/0017; H05K 3/06; H05K 3/4602; H05K 3/4697; H01L 23/66; H01L 23/552; H01L 23/367
See application file for complete search history.

(56) References Cited

U.S. PATENT DOCUMENTS

| | | | |
|---|---|---|---|
| 2022/0272828 A1* | 8/2022 | Ifis | H01L 23/3677 |
| 2022/0377873 A1* | 11/2022 | Wang | H05K 1/0306 |
| 2024/0038630 A1* | 2/2024 | Pfefferlein | H01L 23/49833 |

* cited by examiner

CIRCUIT BOARD WITH EMBEDDED ELECTRONIC COMPONENT AND MANUFACTURING METHOD THEREOF

FIELD

The subject matter herein generally relates to circuit boards, and more particularly, to a circuit board with an embedded electronic component and a manufacturing method of the circuit board.

BACKGROUND

A circuit board may include a circuit substrate and at least one electronic component embedded in the circuit substrate. Embedding the electronic component in the circuit substrate can reduce an overall height of the circuit board. However, heat generated by the electronic component cannot dissipate to the outside environment.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 14:
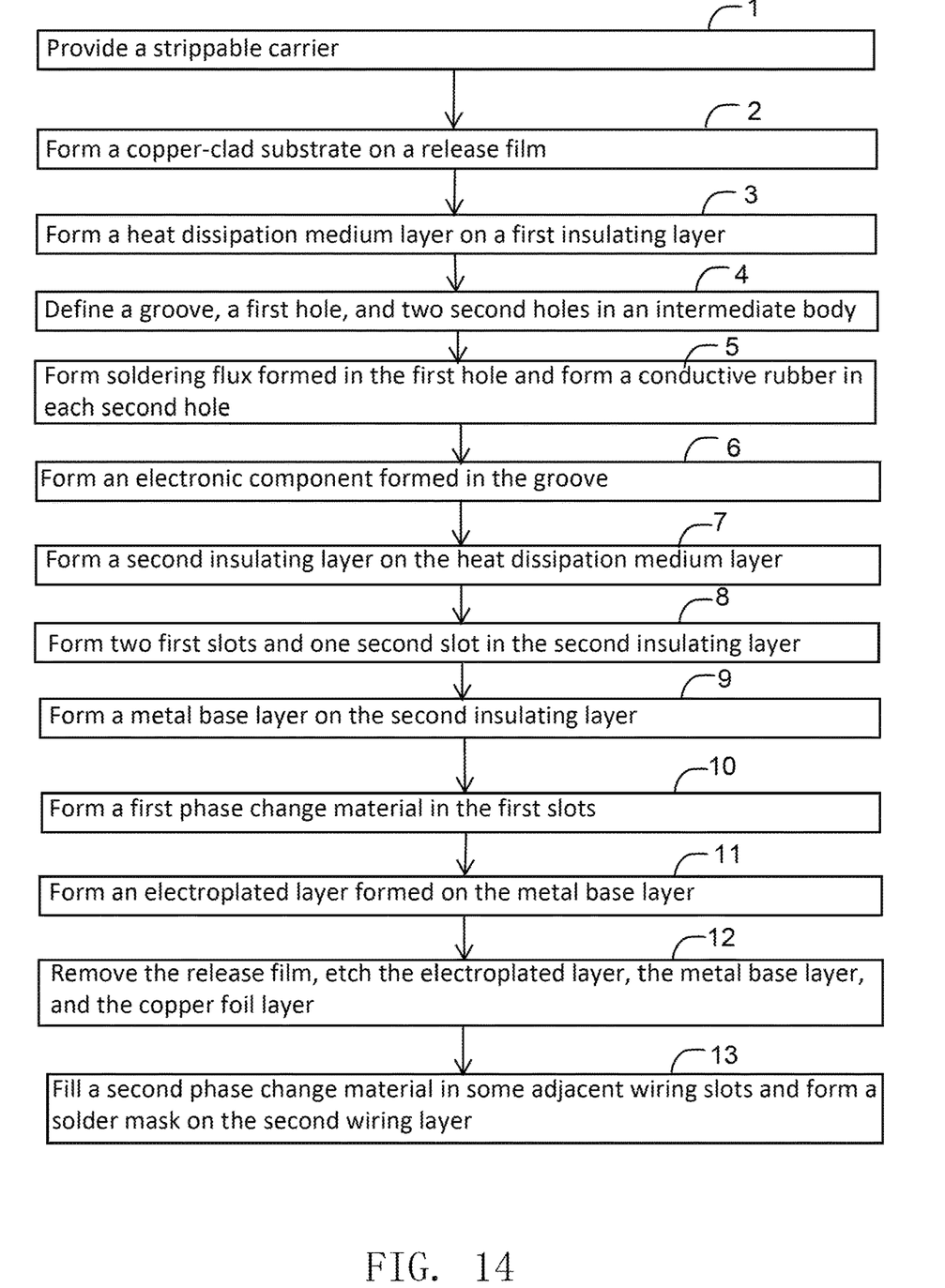
FIG. 14 is a flowchart of a manufacturing method of a circuit board according to an embodiment of the present disclosure.

FIG. 14 illustrates a flowchart of a manufacturing method of a circuit board 100 in accordance with an embodiment. The method is provided by way of embodiments, as there are a variety of ways to carry out the method. Each block shown in FIG. 14 represents one or more processes, methods, or subroutines carried out in the method. Furthermore, the illustrated order of blocks can be changed. Additional blocks may be added or fewer blocks may be utilized, without departing from this disclosure. The method can begin at block 1.

Figure 1:
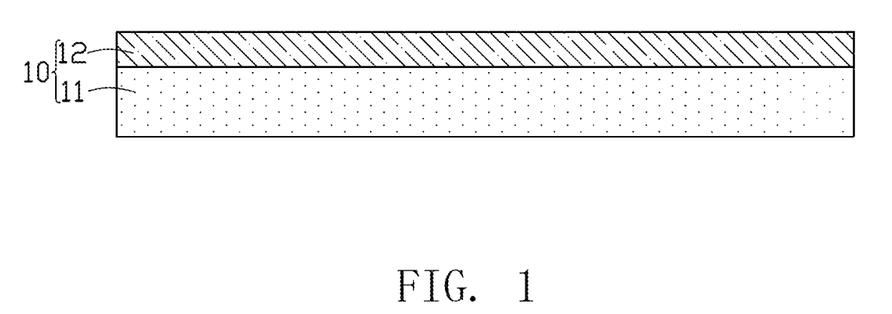
FIG. 1 is a diagrammatic view of a strippable carrier according to an embodiment of the present disclosure.

Block 1, referring to FIG. 1, a strippable carrier 10 is provided, which includes a carrier body 11 and a release film 12 formed on the carrier body 11.

In at least one embodiment, the carrier body 11 may be a glass plate or a ceramic plate. The release film 12 may be a PET release film.

Figure 2:
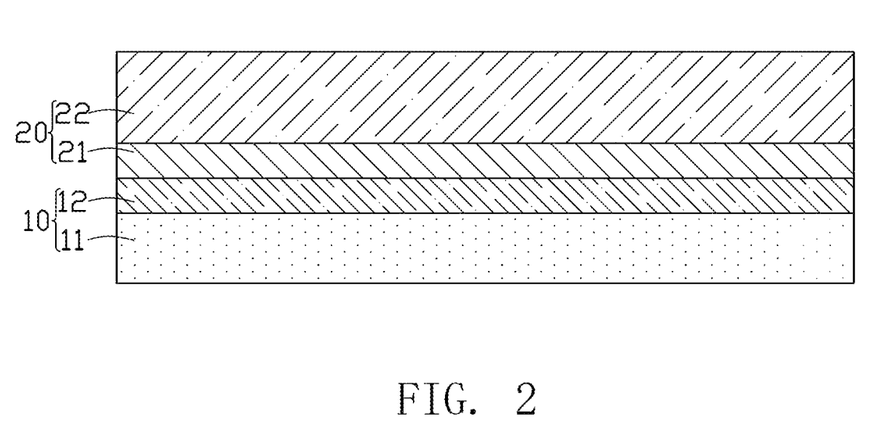
FIG. 2 is a diagrammatic view showing a copper-clad substrate formed on the strippable carrier of FIG. 1.

Block 2, referring to FIG. 2, a copper-clad substrate 20 is formed on the release film 12. The copper-clad substrate 20 includes a copper foil layer 21 and a first insulating layer 22 formed on the copper foil layer 21. The copper foil layer 21 is sandwiched between the first insulating layer 22 and the release film 12.

In at least one embodiment, the first insulating layer 22 may include a thermal conductive and electrical insulating material selected from a group consisting of polyimide (PI), thermoplastic polyimide (TPI), polyethylene terephthalate (PET), polyethylene naphthalate (PEN), polyethylene (PE), polyvinyl chloride (PVC), and any combination thereof.

Figure 3:
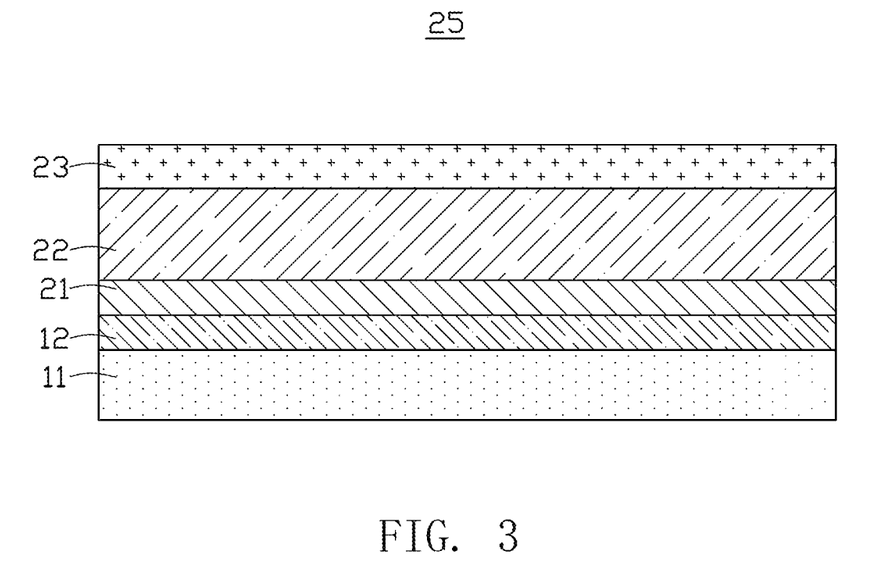
FIG. 3 is a diagrammatic view showing a heat dissipation medium layer formed on the copper-clad substrate of FIG. 2 to obtain an intermediate body.

Block 3, referring to FIG. 3, a heat dissipation medium layer 23 is formed on the first insulating layer 22 to obtain an intermediate body 25.

In at least one embodiment, the heat dissipation medium layer 23 includes an electrical insulating resin and a thermal conductive filler. The electrical insulating resin includes epoxy resin, BT resin, polyphenylene ether, polyimide, and any combination thereof. The thermal conductive filler includes nano silicon oxide powders, nano silicon carbide powders, nano aluminum oxide powders, and any combination thereof.

Figure 4:
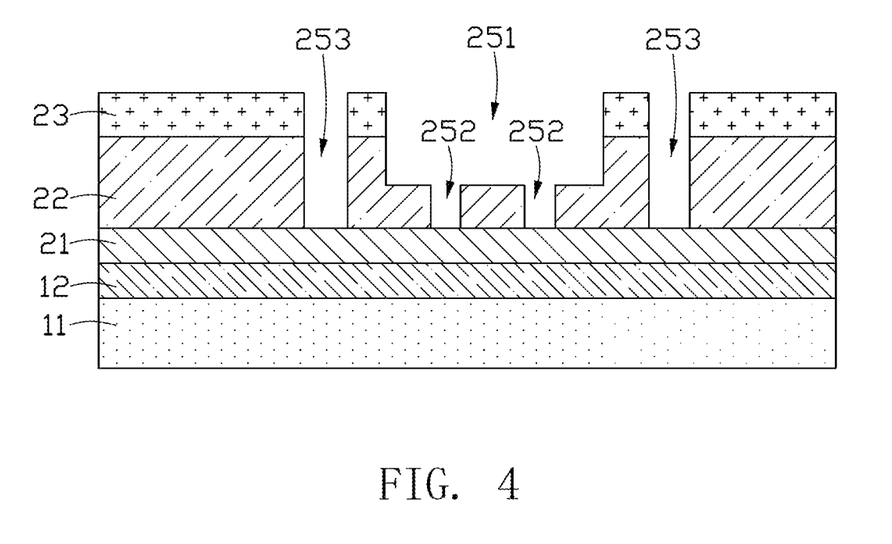
FIG. 4 is a diagrammatic view showing a groove and various holes defined in the intermediate body of FIG. 3.

Block 4, referring to FIG. 4, a groove 251 is defined in the intermediate body 25, and the groove 251 extends through the heat dissipation medium layer 23 and a portion of the first insulating layer 22. At least one first hole 252 is further defined on a bottom surface of the groove 251, causing the copper foil layer 21 to be partially exposed from the first hole 252. Furthermore, two second holes 253 are also defined in the intermediate body 25. Each second hole 253 extends through the heat dissipation medium layer 23 and the first insulating layer 22, causing the copper foil layer 21 to be partially exposed from the second hole 253.

In at least one embodiment, each of the groove 251, the first holes 252, and the second hole 253 is formed by mechanical drilling or laser etching.

Figure 5:
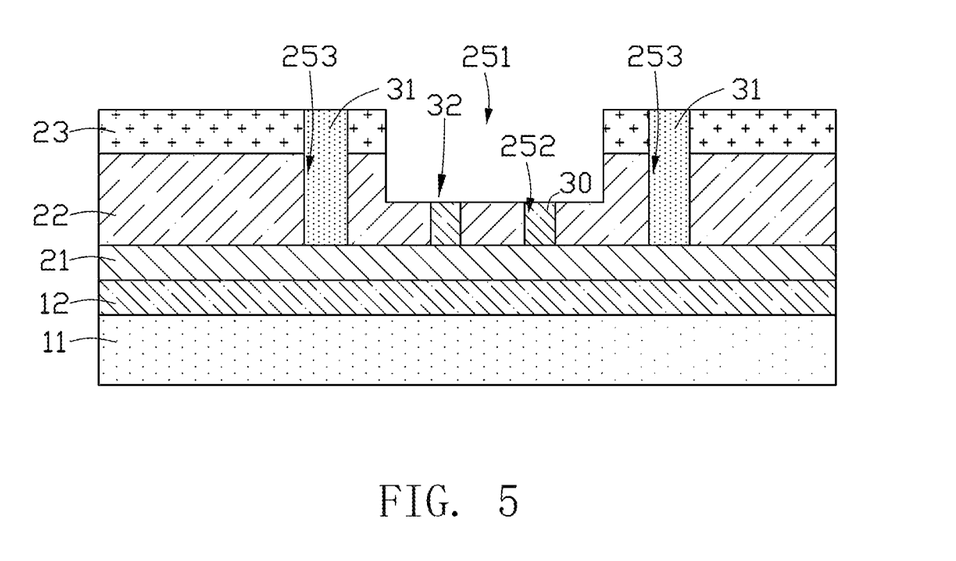
FIG. 5 is a diagrammatic view showing two shielding columns and a soldering flux formed in the holes of FIG. 4.

Block 5, referring to FIG. 5, a soldering flux 30 is formed in the first hole 252 and electrically connected to the copper foil layer 21. Furthermore, a conductive rubber is formed in each of the two second holes 253 to form a shielding column 31, and the two shielding columns 31 is electrically connected to the copper foil layer 21. The two shielding columns 31 and a portion of the copper foil layer 21 between the two shielding columns 31 cooperatively form a shielding space 32.

In at least one embodiment, the conductive rubber includes an adhesive and metal particles dispersed in the adhesive. The adhesive may be silicone, silicone oxide, and any combination thereof. The metal particles may be silver, copper, and aluminum.

Figure 6:
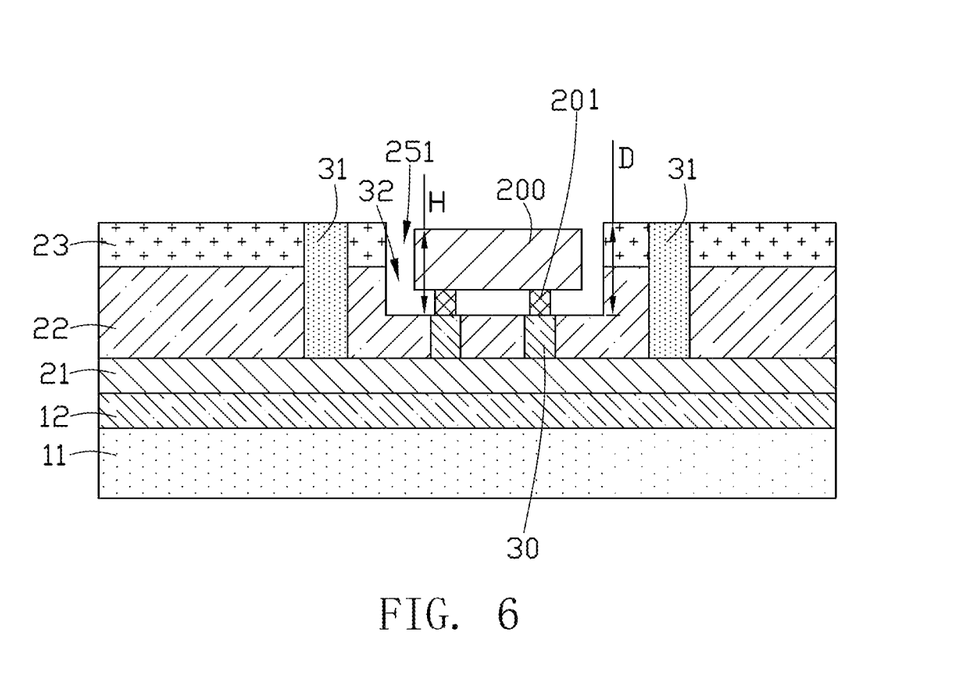
FIG. 6 is a diagrammatic view showing an electronic component formed in the groove of FIG. 5.

Block 6, referring to FIG. 6, an electronic component 200 having two pins 201 is formed in the groove 251. The soldering flux 30 is melted by welding, causing the pins 201 of the electronic component 200 to electrically connect to the copper foil layer 21.

In at least one embodiment, a height H of the electronic component 200 is not greater than a depth D of the groove 251. That is, the electronic component 200 is totally disposed in the shielding space 32.

By disposing the electronic component 200 in the shielding space 32, an electromagnetic shielding effect is realized, and an overall thickness of the circuit board 100 is also reduced. Furthermore, since the soldering flux 30 is formed in each first hole 252, the first hole 252 can avoid short circuit generated by a flow of the melted soldering flux 30, and also can avoid an external spaced required to receiving the soldering flux 30, thus further reducing the overall thickness of the circuit board 100.

Figure 7:
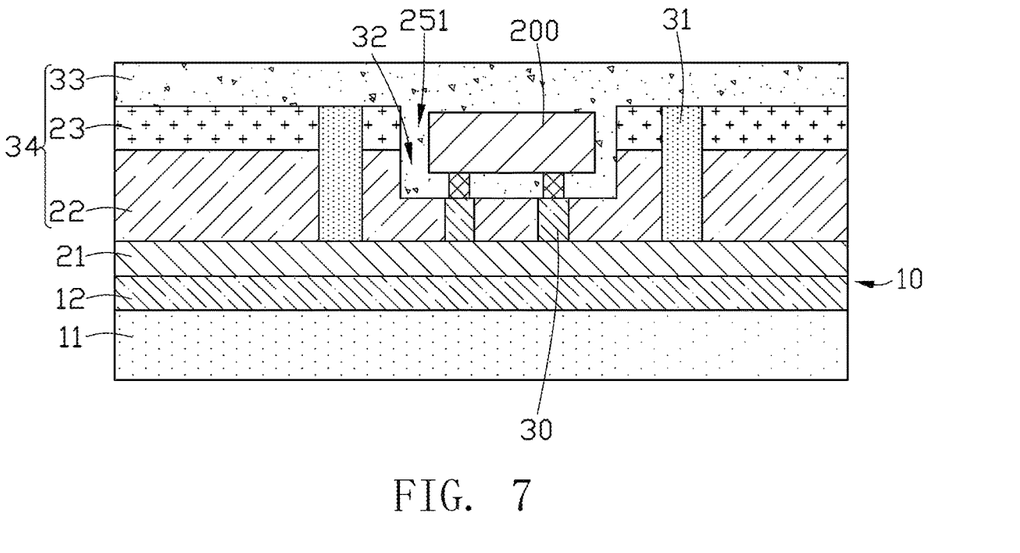
FIG. 7 is a diagrammatic view showing a second insulating layer formed on the heat dissipation medium layer of FIG. 6.

Block 7, referring to 7, a second insulating layer 33 is formed on the heat dissipation medium layer 23. The second insulating layer 33 further fills a gap between the groove 251 and the electronic component 200. Thus, the electronic component 200 is encapsulated and fixed in the groove 251. The first insulating layer 22, the second insulating layer 33, and the heat dissipation medium layer 23 cooperatively form an insulating substrate 34. The electronic component 200 is embedded in the insulating substrate 34.

Figure 8:
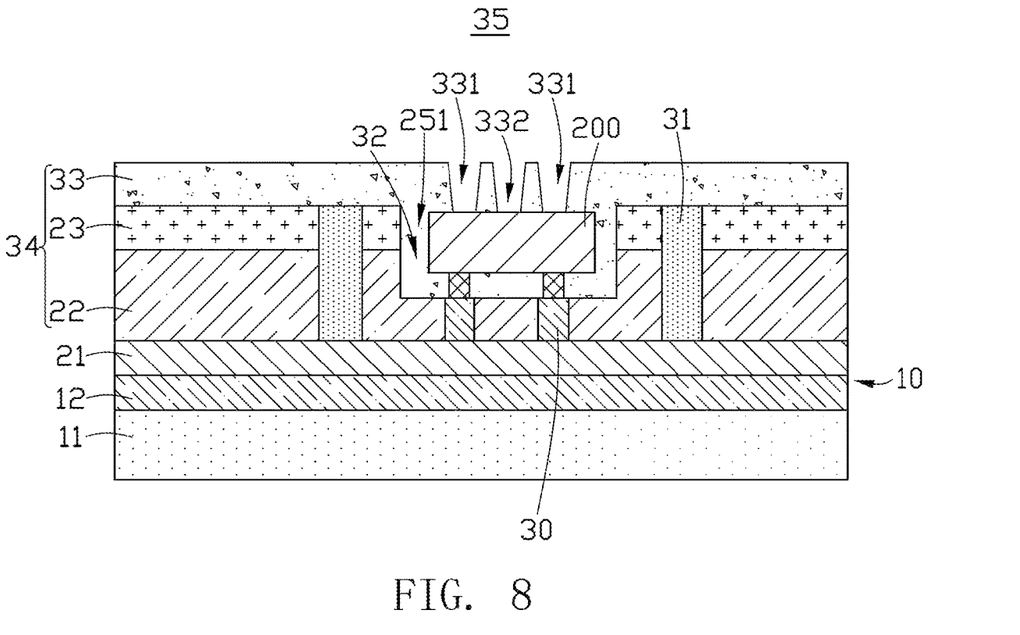
FIG. 8 is a diagrammatic view showing various slots defined in the second insulating layer of FIG. 7.

Block 8, referring to FIG. 8, two first slots 331 and one second slot 332 are defined in the second insulating layer 33, and the electronic component 200 is partially exposed from each of the two first slots 331 and the second slot 332. Then, a circuit substrate 35 is obtained.

The two first slots 331 are spaced from each other. The second slot 332 is disposed between the two first slots 331.

Figure 9:
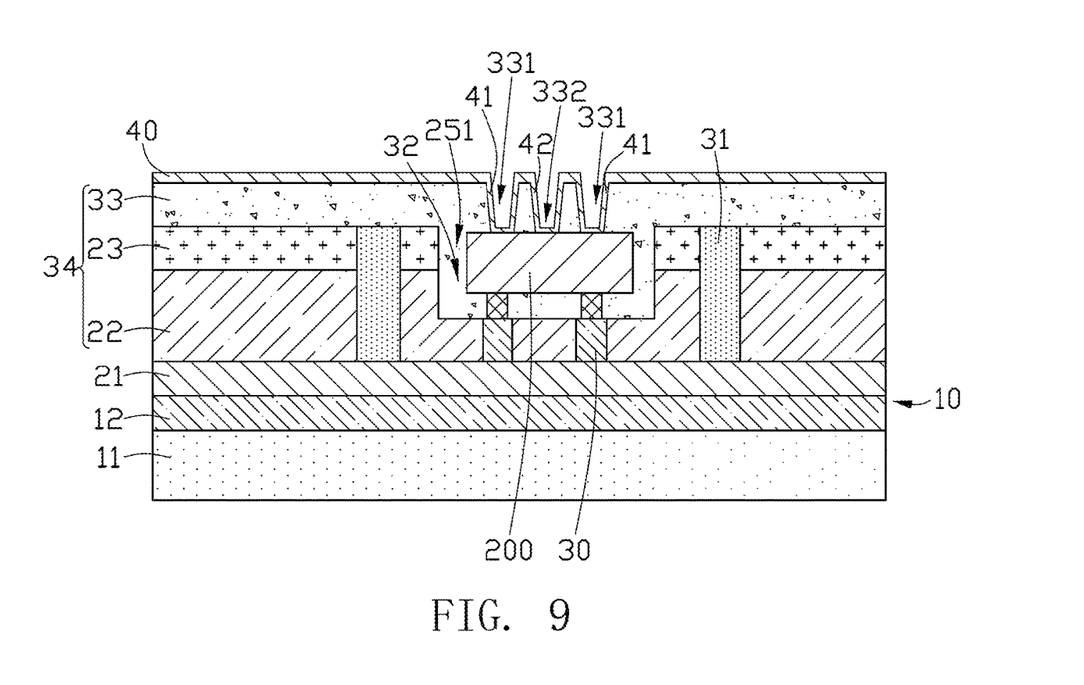
FIG. 9 is a diagrammatic view showing a metal base layer formed on the second insulating layer of FIG. 8.

Block 9, referring to FIG. 9, a metal base layer 40 is formed on the second insulating layer 33. The metal base layer 40 also fills in each of the two first slots 331 to form a thermal conductive base layer 41, and also fills in the second slot 332 to form an electric conductive base layer 42.

In at least one embodiment, the metal base layer 40 is a copper layer formed by sputtering.

Figure 10:
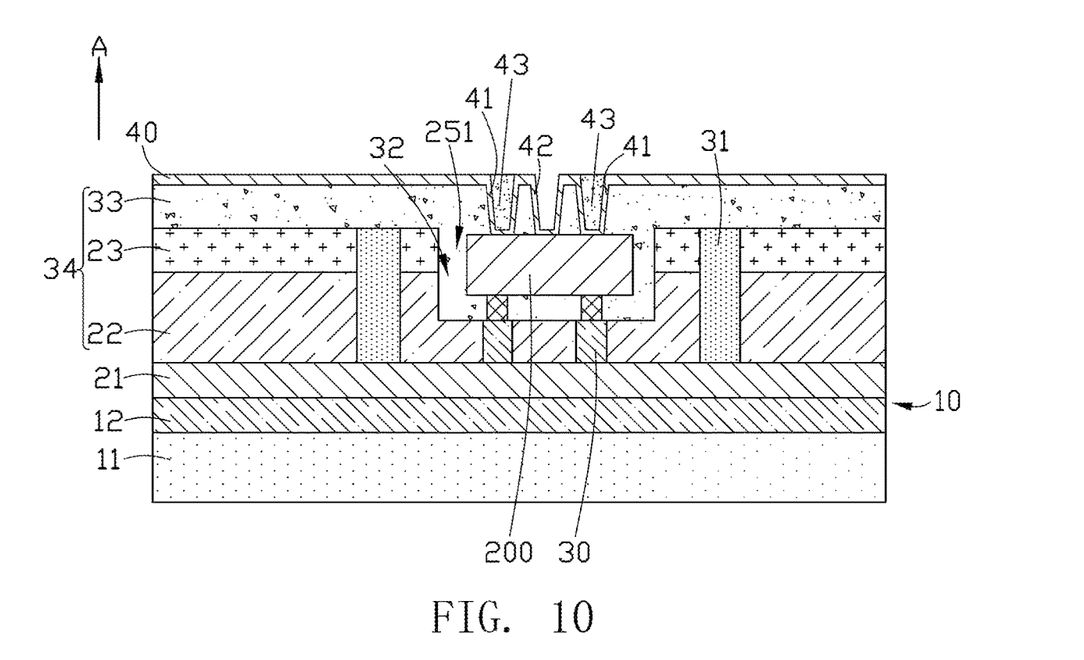
FIG. 10 is a diagrammatic view showing a first phase change material filled in some slots of FIG. 9.

Block 10, referring to FIG. 10, a first phase change material 43 is formed on the thermal conductive base layer 41, so that heat generated by the electronic component 200 can be transferred to the thermal conductive base layer 41 and the first phase change material 43. That is, the first phase change material 43 is thermally connected to the electronic component 200.

The first phase change material 43 can conduct the heat along a thickness direction A of the insulating substrate 34.

The thermal conductive base layer 41 also functions as a container for receiving the first phase change material 43, which can prevent a leakage of the first phase change material 43. In other embodiments, the metal base layer 40 may also be omitted. That is, the first phase change material 43 is directly formed in the two first slots 331 and in contact with the electronic component 200.

In at least one embodiment, the first phase change material 43 includes a solid-liquid phase change material such as paraffin, advanced fatty acid, polyolefin, and any combination thereof. In other embodiments, the first phase change material 43 may also include conductive powders, such as copper powders, aluminum powders, graphite powders, and any combination thereof. The first phase change material 43 is soften and become liquid after being heated, which can store heat energy. A portion of the stored heat energy may be transferred to the outside environment, and the remaining portion of the heat energy may be used to maintain the temperature of the insulating substrate 34 and the temperature of the electronic component 200 that can then work normally.

Figure 11:
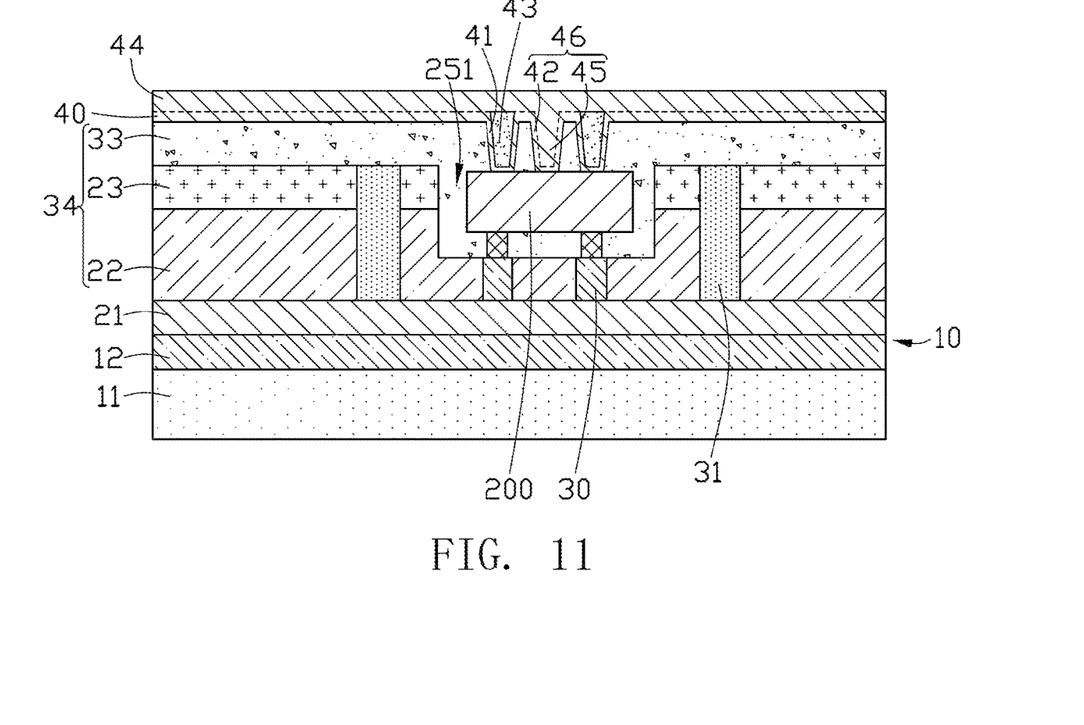
FIG. 11 is a diagrammatic view showing an electroplated layer formed on the metal base layer of FIG. 10.

Block 11, referring to FIG. 11, an electroplated layer 44 is formed on the metal base layer 40 through electroplating. The electroplated layer 44 is also formed on the electric conductive base layer 42 to form a conductive body 45. The conductive body 45 and the electric conductive base layer 42 cooperatively form an electric conductive column 46. The electric conductive column 46 is electrically connected to a surface of the electronic component 200 away from the soldering flux 30.

Figure 12:
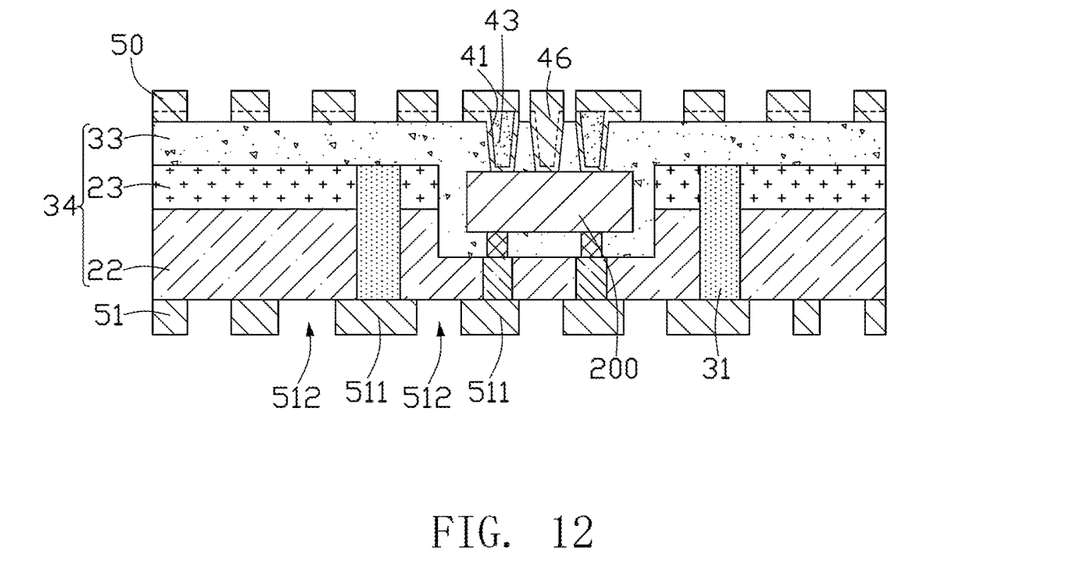
FIG. 12 is a diagrammatic view showing the electroplated layer and metal base layer of FIG. 10 etched to form a first wiring layer, and the copper foil layer of FIG. 10 etched to form a second wiring layer.

Block 12, referring to FIG. 12, the release film 12 is removed to expose the copper foil layer 21. Then, the electroplated layer 44 and the metal base layer 40 are etched to form a first wiring layer 50, and the copper foil layer 21 is etched to form a second wiring layer 51.

The first wiring layer 50 is electrically connected to a surface of the electronic component 200 through the electric conductive column 46. The first wiring layer 50 is further thermally connected to the electronic component 200 through the first phase change material 43 and the thermal conductive base layer 41. The second wiring layer 51 is connected to another surface of the electronic component 200 through the soldering flux 30. The second wiring layer 51 includes a number of wiring portions 511 spaced from each other. Two of the wiring portions 511 are connected to the two shielding columns 31. A wiring slot 512 is formed between two adjacent wiring portions 511, and the first insulating layer 22 is partially exposed from the wiring slot 512.

Figure 13:
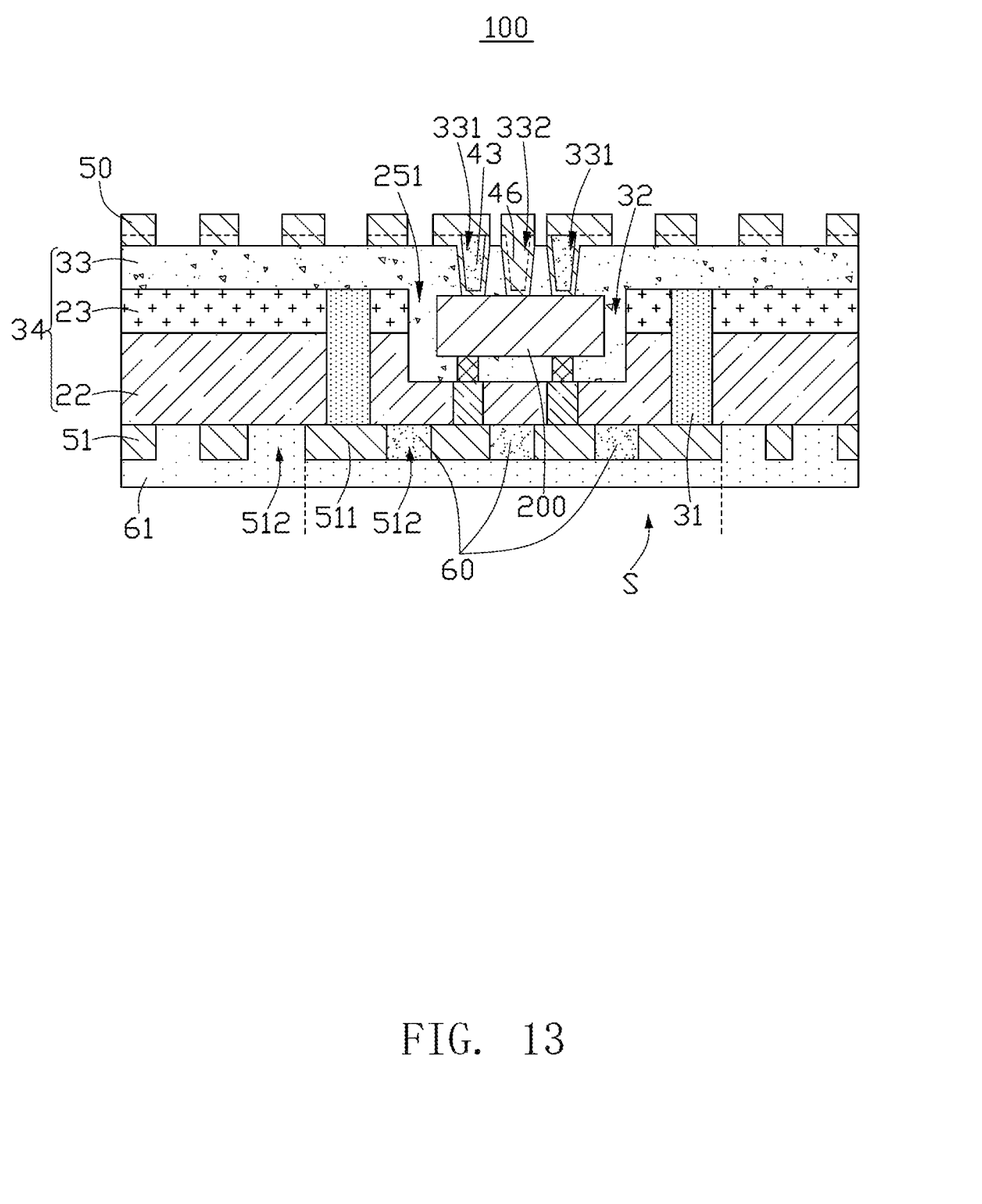
FIG. 13 is a diagrammatic view of a circuit board according to an embodiment of the present disclosure.

Block 13, referring to FIG. 13, a second phase change material 60 fills in some adjacent wiring slots 512. Then, a solder mask 61 is formed on the second wiring layer 51, which covers the second phase change material 60 and the wiring portions 511.

The second phase change material 60 thermally connects some adjacent wiring portions 511 together to form a heat dissipation zone S. The heat dissipation zone S can correspond to the electronic component 200. The heat dissipation zone S can increase a heat dissipation area and improve the heat dissipation efficiency of the electronic component 200. In at least one embodiment, the second phase change material 60 includes paraffin, higher fatty acid, polyolefin, and any combination thereof.

In the manufacturing method of the circuit board 100 according to the present disclosure, the electronic component 200 is embedded in the insulating substrate 34, and the thermal conduction between the electronic component 200 and the first wiring layer 50 is realized through the first phase change material 43. Thus, the thermal conductivity of the electronic component 200 along the thickness direction A is improved. Moreover, by filling the wiring slots 512 of the second wiring layer 51 with the second phase change material 60, the thermal conduction between the wiring portions 511 and the electronic component 200 is achieved. Thus, the heat dissipation area and the heat dissipation efficiency of the electronic component 200 are improved.

Referring to FIG. 13, a circuit board 100 is also provided according to an embodiment of the present disclosure. The circuit board 100 includes a circuit substrate 35, a first phase change material 43, and a first wiring layer 50. The circuit substrate 35 includes an insulating substrate 34 and an electronic component 200 embedded in the insulating substrate 34. A number of first slots 331 are defined in the insulating substrate 34 and spaced from each other. The electronic components 200 are partially exposed from the first slots 331. The first phase change material 43 is formed in each of the first slots 331. The first phase change material 43 is thermally connected to the electronic component 200. The first wiring layer 50 is formed on the insulating substrate 34 and covers the first slots 331. The first phase change material 43 is thermally connected to the first wiring layer 50.

In at least one embodiment, the circuit board 100 further includes a second wiring layer 51 and a second phase change material 60. The second wiring layer 51 is formed on the insulating substrate 34, and the insulating substrate 34 is between the first wiring layer 50 and the second wiring layer 51. The second wiring layer 51 includes a number of wiring portions 511 spaced from each other. A wiring slot 512 is formed between two adjacent wiring portions 511, and the insulating substrate 34 is partially exposed from the wiring slot 512. The electronic component 200 is electrically connected to the second wiring portion 511. The second phase change material 60 is formed in some adjacent wiring slots 512. The second phase change material 60 thermally connects some adjacent wiring portions 511 together to form a heat dissipation zone S. The heat dissipation zone S can correspond to the electronic component 200.

In at least one embodiment, the circuit board 100 further includes a thermal conductive base layer 41 formed in each of the first slots 331. The first phase change material 43 is formed on the thermal conductive base layer 41. The thermal conductive base layer 41 thermally connects the first phase change material 43 to the electronic component 200.

In at least one embodiment, the circuit board 100 further includes two shielding columns 31 formed in the insulating substrate 34 and spaced from each other. The two shielding columns 31 and the second wiring layer 51 between the two shielding columns 31 cooperatively form a shielding space 32. The electronic component 200 is formed in the shielding space 32, thus improving the anti-interference ability of the electronic component 200 against external electromagnetic waves.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A manufacturing method of a circuit board, comprising:
   providing a circuit substrate, wherein the circuit substrate comprises an insulating substrate and an electronic component embedded in the insulating substrate, the insulating substrate defines two first slots to partially expose the electronic component;
   filling a first phase change material in the two first slots, causing the first phase change material to thermally connect to the electronic component;
   forming a first wiring layer on a surface of the insulating substrate, causing the first wiring layer to cover the two first slots and thermally connect to the first phase change material;
   forming a second wiring layer on another surface of the insulating substrate, wherein the second wiring layer comprises a plurality of wiring portions and a wiring slot formed between adjacent two of the plurality of wiring portions, the electronic component is electrically connected to the second wiring portion; and
   filling a second phase change material in at least one of the wiring slot, causing the second phase change material to thermally connect a portion of the plurality of wiring portions together to form a heat dissipation zone.

2. The manufacturing method according to claim 1, wherein before filling the first phase change material in the two first slots, the manufacturing method further comprises:
   forming a metal base layer on the insulating substrate, causing the metal base layer to fill in the two slots to form two thermal conductive bottom layers, wherein the first phase change material is formed on the two thermal conductive bottom layers.

3. The manufacturing method according to claim 2, wherein forming the first wiring layer on the insulating substrate comprises:
   forming an electroplated layer on the metal base layer; and
   etching the metal base layer and the electroplated layer to form the first wiring layer.

4. The manufacturing method according to claim 3, wherein before filling the first phase change material in the two first slots, the manufacturing method further comprises:
   defining a second slot in the insulating substrate, wherein the metal base layer further fills in the second slot to form an electric conductive bottom layer, the electric conductive bottom layer is electrically connected to the electronic component, the electroplated layer is further formed on the electric conductive bottom layer to form a conductive body, the electric conductive bottom layer and the conductive body cooperatively form an electric conductive column, and the electric conductive column electrically connects the electroplated layer to the electronic component.

5. The manufacturing method according to claim 1, wherein the insulating substrate comprises a first insulating layer and a heat dissipation medium layer formed on the first insulating layer, the circuit substrate further comprises a copper foil layer formed on the first insulating layer, forming the second wiring layer on the insulating substrate comprises:
   defining a groove on the heat dissipation medium layer, and defining a first hole on a bottom surface of the groove to partially expose the copper foil layer;
   forming a soldering flux in the first hole;
   forming the electronic component in the groove, causing the soldering flux to electrically connect the electronic component to the copper foil layer; and etching the copper foil layer to form the second wiring layer.

6. The manufacturing method according to claim 5, wherein after defining the groove on the heat dissipation medium layer, the method further comprises:
forming a second insulating layer on the heat dissipation medium layer to form an intermediate body, wherein the first insulating layer, the second insulating layer, and the heat dissipation medium layer cooperatively form the insulating substrate.

7. The manufacturing method according to claim 6, further comprising:
defining two second holes in the intermediate body, wherein each of the two second holes extends through the heat dissipation medium layer and the first insulating layer, and the copper foil layer is partially exposed from the two second holes; and
forming two shielding columns in the two second holes, wherein the second wiring layer is connected to the two shielding columns, the two shielding columns and the second wiring layer between the two shielding columns cooperatively form a shielding space, and the electronic component is formed in the shielding space.

8. The manufacturing method according to claim 5, wherein the circuit substrate further comprises a strippable carrier formed on the copper foil layer, before etching the copper foil layer, the manufacturing method further comprises:
removing the strippable carrier to expose the copper foil layer.

9. The manufacturing method according to claim 5, wherein after forming the electronic component in the groove, a height of the electronic component is not greater than a depth of the groove.

10. The manufacturing method according to claim 1, wherein after forming the heat dissipation zone, the heat dissipation zone corresponds to the electronic component.

11. A circuit board, comprising:
a circuit substrate comprising an insulating substrate and an electronic component embedded in the insulating substrate, the insulating substrate defining two first slots to partially expose the electronic component;
a first phase change material filled in the two first slots, the first phase change material thermally connecting to the electronic component;
a first wiring layer formed on a surface of the insulating substrate, the first wiring layer covering the two first slots and thermally connecting to the first phase change material;
a second wiring layer formed on another surface of the insulating substrate, the second wiring layer comprising a plurality of wiring portions and a wiring slot formed between adjacent two of the plurality of wiring portions, the electronic component being electrically connected to the second wiring portion;
a second phase change material filled in at least one of the wiring slot, the second phase change material thermally connecting to a portion of the plurality of wiring portions together to form a heat dissipation zone.

12. The circuit board according to claim 11, wherein the heat dissipation zone corresponds to the electronic component.

13. The circuit board according to claim 11, wherein the first phase change material comprises at least one of paraffin, advanced fatty acid, and polyolefin, and at least one of copper powder, aluminum powder, and graphite powder.

14. The circuit board according to claim 11, wherein the circuit board further comprises a thermal conductive base layer formed in each of the two first slots, the first phase change material is formed on the thermal conductive base layer, and the thermal conductive base layer thermally connects the first phase change material to the electronic component.

15. The circuit board according to claim 11, wherein the insulating substrate further defines a second slot to partially expose the electronic component, the circuit board further comprises a conductive body formed in the second slot, the conductive body electrically connects the first wiring layer to the electronic component.

16. The circuit board according to claim 15, wherein an electric conductive bottom layer is further formed in the second slot, the conductive body is formed on the electric conductive bottom layer, the electric conductive bottom layer and the conductive body cooperatively form an electric conductive column.

17. The circuit board according to claim 11, wherein the insulating substrate further defines two second holes and two shielding columns formed in the two second holes, the two shielding columns and the second wiring layer between the two shielding columns cooperative form a shielding space, and the electronic component is formed in the shielding space.

18. The circuit board according to claim 11, wherein the heat dissipation zone corresponds to the electronic component.

* * * * *